(12) United States Patent
Gao et al.

(10) Patent No.: US 10,818,215 B2
(45) Date of Patent: Oct. 27, 2020

(54) DISPLAY PANEL AND DISPLAY APPARATUS

(71) Applicant: WuHan TianMa Micro-Electronics Co., Ltd., Wuhan (CN)

(72) Inventors: Wei Gao, Wuhan (CN); Ping An, Wuhan (CN); Lei Zhang, Wuhan (CN); Jinghua Niu, Wuhan (CN); Wenpeng Dai, Wuhan (CN); Mingzhi Dai, Wuhan (CN)

(73) Assignee: WuHan TianMa Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/423,134

(22) Filed: May 27, 2019

(65) Prior Publication Data

US 2019/0279548 A1 Sep. 12, 2019

(30) Foreign Application Priority Data

Dec. 29, 2018 (CN) .......................... 2018 1 1634430

(51) Int. Cl.
| | |
|---|---|
| *G09G 5/10* | (2006.01) |
| *G09G 5/00* | (2006.01) |
| *G06F 3/038* | (2013.01) |
| *G09G 3/20* | (2006.01) |

(Continued)

(52) U.S. Cl.
CPC ........... *G09G 3/2003* (2013.01); *G02B 5/003* (2013.01); *G09G 3/22* (2013.01)

(58) Field of Classification Search
CPC ............................................... G02F 1/133528
See application file for complete search history.

(56) References Cited

U.S. PATENT DOCUMENTS

2001/0053004 A1* 12/2001 Nishikawa ........... G02B 5/0252
359/15
2013/0285023 A1* 10/2013 Kurata ................ H01L 51/5265
257/40

(Continued)

FOREIGN PATENT DOCUMENTS

| CN | 108598278 A | 9/2018 |
|---|---|---|
| WO | 2017183625 A1 | 10/2017 |

OTHER PUBLICATIONS

Office Action of Chinese Patent Application No. 201811634430.3 dated Aug. 5, 2020.

*Primary Examiner* — Nan-Ying Yang
(74) *Attorney, Agent, or Firm* — Kilpatrick Townsend & Stockton, LLP

(57) ABSTRACT

The present disclosure provides a display panel and a display apparatus. The display panel includes: light-emitting elements which include a first light-emitting element that emits light of a first color having a wavelength ranging from $\lambda 1$ to $\lambda 2$, a second light-emitting element that emits light of a second color having a wavelength ranging from $\lambda 3$ to $\lambda 4$, and a third light-emitting element that emits light of a third color having a wavelength ranging from $\lambda 5$ to $\lambda 6$; and first to third capping layers respectively covering light-exiting sides of the first to third light-emitting elements. At least one of the first to third capping layers contains an ultraviolet light absorber that can absorb light having a wavelength ranging from 380 nm to 410 nm with an absorption rate greater than or equal to 20%.

14 Claims, 3 Drawing Sheets

(51) Int. Cl.
*G02B 5/00* (2006.01)
*G09G 3/22* (2006.01)

(56) References Cited

U.S. PATENT DOCUMENTS

2014/0312325 A1* 10/2014 Jang ................... H01L 27/322
　　　　　　　　　　　　　　　　　　　257/40
2017/0317315 A1* 11/2017 Yang ................... H01L 27/322

* cited by examiner

DISPLAY PANEL AND DISPLAY APPARATUS

CROSS-REFERENCE TO RELATED APPLICATIONS

The present disclosure claims priority to Chinese Patent Application No. 201811634430.3, filed on Dec. 29, 2018, the content of which is incorporated herein by reference in its entirety.

FIELD

The present disclosure relates to the field of display technologies and, in particular to a display panel, and a display apparatus including the display panel.

BACKGROUND

With the development of display technologies, consumers' requirements on display panels are constantly increasing, and various display panels appear on the market and have been rapidly developed, such as the liquid crystal display panel and the organic light-emitting display panel. On the basis of this, the display technologies of 3D display, touch display, curved display, ultra-high resolution display and peep-proof display are constantly emerging to meet the needs of consumers.

The organic light-emitting display panel is favored by consumers due to its advantages of light weight, bendability, high contrast, low power consumption, and the like. Therefore, the organic light-emitting display panel keeps an increasing market share year by year, and is the focus of the research in the display technology field. In the organic light-emitting display panel, the organic light-emitting element is a pivotal component for generating and emitting light. The power consumption, contrast, and user experience of the display panel are directly affected by the light extraction efficiency and the light color purity of the organic light-emitting element, and whether the organic light-emitting element emits high-energy light harmful to the human eye. In addition, during the use of the display panel, ambient light may cause decomposition of material of the organic light-emitting element and thus result in a significant deterioration of the contrast of the display panel. Therefore, solved solution in the current organic light-emitting technology field is how to further adjust the color purity of the light emitted from the organic light-emitting element, how to eliminate the light harmful to the human eye, and how to avoid the decomposition of the organic light-emitting material under ambient light irradiation, as well as how to enhance the contrast of the display panel under ambient light is needed.

SUMMARY

In view of the above, the present disclosure provides a display panel and a display apparatus, aiming to avoid the decomposition of the organic light-emitting material under ambient light irradiation, enhance the contrast of the display panel under ambient light, so as to guarantee an excellent display effect of the display panel.

One embodiment of the present disclosure provides a display panel including a plurality of light-emitting elements, the plurality of light-emitting elements including a first light-emitting element that emits light of a first color having a wavelength ranging from $\lambda 1$ to $\lambda 2$, a second light-emitting element that emits light of a second color having a wavelength ranging from $\lambda 3$ to $\lambda 4$, and a third light-emitting element that emits light of a third color having a wavelength ranging from $\lambda 5$ to $\lambda 6$, a first capping layer covering a light-exiting side of the first light-emitting element, a second capping layer covering a light-exiting side of the second light-emitting element, and a third capping layer covering a light-exiting side of the third light-emitting element, and at least one of the first capping layer, the second capping layer and the third capping layer contains an ultraviolet light absorber, and the ultraviolet light absorber absorbs light having a wavelength ranging from 380 nm to 410 nm with an absorption rate A (380 nm-410 nm) greater than or equal to 20%.

Another embodiment of the present disclosure provides a display apparatus including the above display panel.

In the display panel and the display apparatus provided by the embodiments of the present disclosure, the capping layer is divided into the first capping layer corresponding to the first light-emitting element, the second capping layer corresponding to the second light-emitting element, and the third capping layer corresponding to the third light-emitting element. That is, the capping layer is regionalized to correspond to the respective light-emitting elements. In addition, at least one of the first capping layer, the second capping layer and the third capping layer contains the ultraviolet light absorber, and the ultraviolet light absorber can absorb light having the wavelength ranging from 380 nm to 410 nm with the absorption rate greater than or equal to 20%. The ultraviolet light, due to its high energy, can easily decompose organic light-emitting materials, in particularly phosphorescent materials, and has detrimental effects on human eyes. In the present disclosure, through the addition of the ultraviolet light absorber in at least one of the first capping layer, the second capping layer and the third capping layer, the irradiation of the ultraviolet light on the phosphorescent material can be reduced, and the human eyes are protected from being irradiated by the high energy light, thereby improving the performance of the display panel and providing a better user experience.

DESCRIPTION OF EMBODIMENTS

The present disclosure is further described with embodiments in combination of the accompanying drawings, in order to explain the above purposes, features and advantages of the present disclosure in detail.

It should be understood that details mentioned in the following description are merely intended to facilitate understanding of the present disclosure. The present disclosure can be implemented in other manner than those described herein.

Figure 1:
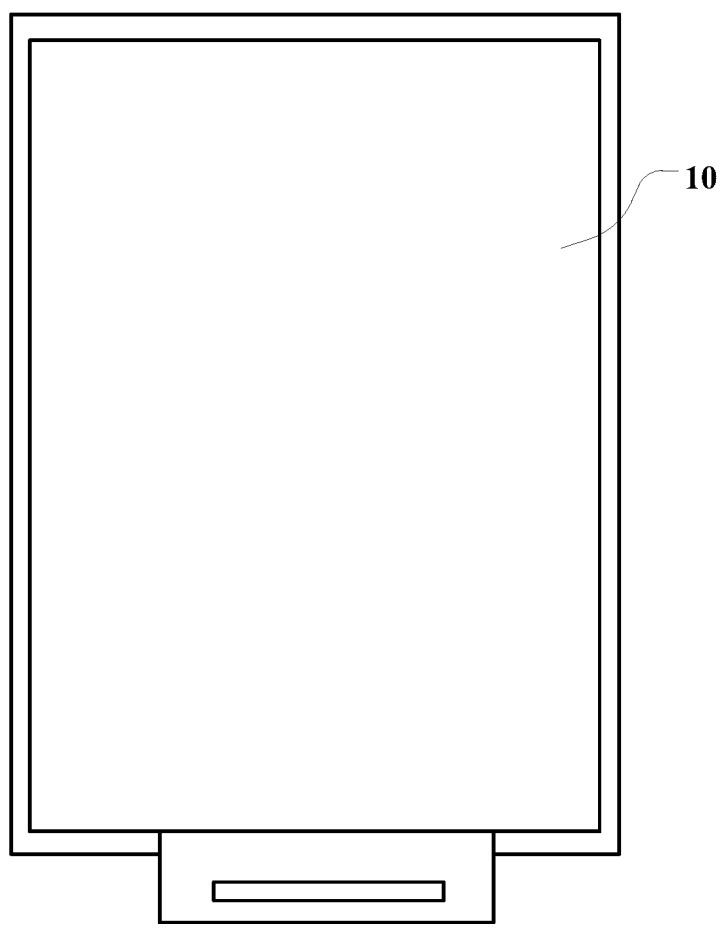
FIG. 1 is a schematic diagram of a display panel according to an embodiment of the present disclosure.

FIG. 1 is a schematic diagram of a display panel according to an embodiment of the present disclosure. As shown in FIG. 1, the display panel 10 includes a light-emitting element, and can be an organic light-emitting display panel. The organic light-emitting display panel includes an anode, a cathode, and an organic light-emitting layer disposed between the anode and the cathode. When a voltage is applied between the anode and the cathode, carriers are excited to transfer and act on the organic light-emitting layer to emit light. In other variations of the present embodiment, the display panel 10 can also be other types of display panel, such as a quantum dot light-emitting display panel, a nanowafer light-emitting display panel, etc., which are not specifically described in this embodiment.

Figure 2:
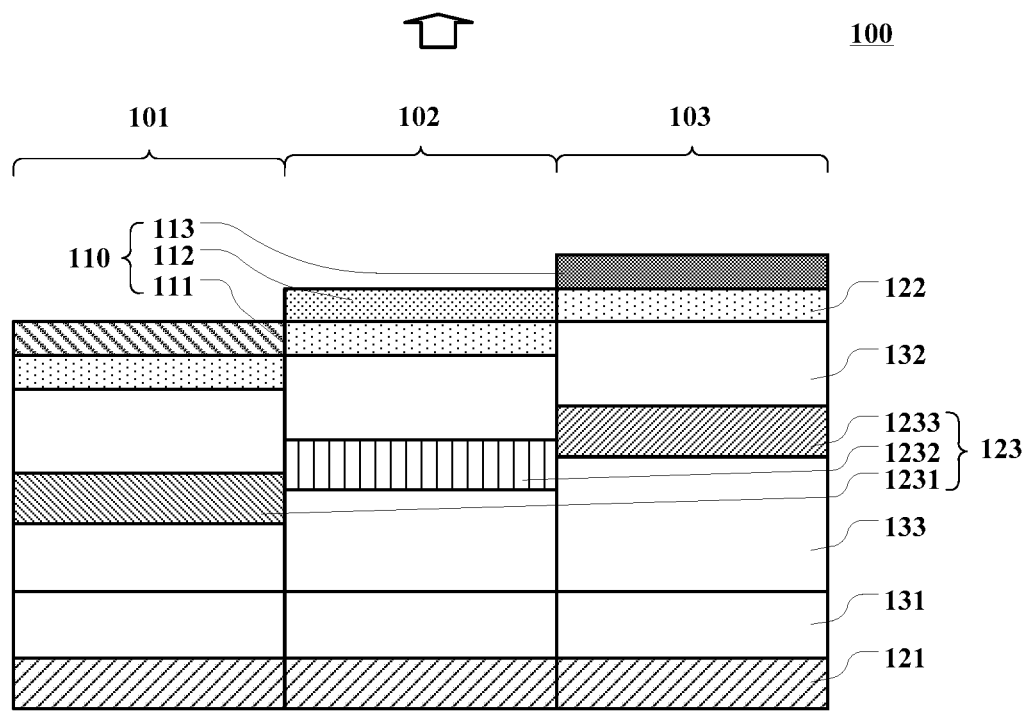
FIG. 2 is a schematic diagram of a light-emitting element according to an embodiment of the present disclosure.

FIG. 2 is a schematic diagram of a light-emitting element according to an embodiment of the present disclosure. Referring to FIG. 2, the light-emitting element 100 includes a first light-emitting element 101 that emits light of a first color having a wavelength ranging from $\lambda 1$ to $\lambda 2$, a second light-emitting element 102 that emits light of a second color having a wavelength ranging from $\lambda 3$ to $\lambda 4$, and a third light-emitting element 103 that emits light of a third color having a wavelength ranging from $\lambda 5$ to $\lambda 6$. The display panel 10 further includes a capping layer 110 covering a light-exiting side of the light-emitting element 100. The capping layer 110 includes a first capping layer 111 covering a light-exiting side of the first light-emitting element 101, a second capping layer 112 covering a light-exiting side of the second light-emitting element 102, and a third capping layer 113 covering a light-exiting side of the third light-emitting element 103. At least one of the first capping layer 111, the second capping layer 112 and the third capping layer 113 contains an ultraviolet light absorber, which can absorb light having a wavelength ranging from 380 nm to 410 nm with an absorption rate A greater than or equal to 20%.

It should be understood that, in the present embodiment, each of the first to third light-emitting elements 101, 102, 103 includes an anode 121, a cathode 122 disposed oppositely to the anode 121, a light-emitting layer 123 disposed between the anode 121 and the cathode 122, a hole transmission layer 131 disposed between the anode 121 and the light-emitting layer 123, and an electron transmission layer 132 disposed between the cathode 122 and the light-emitting layer 123. In addition, an optical adjustment layer 133 can be provided between the hole transmission layer 131 and the light-emitting layer 123. The optical adjustment layer 133 has a thickness varied depending upon the color of light emitted by the light-emitting element, so that a microcavity length of the light-emitting elements of different colors can be adjusted specifically. The light-emitting layer 123 includes a first light-emitting layer 1231, a second light-emitting layer 1232, and a third light-emitting layer 1233. The first light-emitting element 101 includes the first light-emitting layer 1231 emitting the light of the first color having the wavelength ranging from $\lambda 1$ to $\lambda 2$. The second light-emitting element 102 includes the second light-emitting layer 1232 emitting the light of the second color having the wavelength ranging from $\lambda 3$ to $\lambda 4$. The third light-emitting element 103 includes the third light-emitting layer 1233 emitting the light of the third color having the wavelength ranging from $\lambda 5$ to $\lambda 6$. In addition, in the present embodiment, the light-emitting element 100 is a top emission type device. That is, the anode 121 is a total reflection electrode, and the cathode 122 is a semi-transparent electrode, so that light is emitted from a side of the cathode 122, and the capping layer 110 is disposed on the cathode 122.

In addition, in the present embodiment, the capping layer 110 is generally an organic transparent material, and mainly targets to improve an emergence angle of the emitted light. Since the capping layer 110 is disposed on the light-exiting side of the light-emitting element 100, the capping layer can be doped with a light absorber, so as to modify the emitted light and avoid the light-emitting material being irradiated by harmful light.

In view of the above description, in the display panel provided by the embodiment of the present disclosure, the capping layer 110 is divided into the first capping layer 111 corresponding to the first light-emitting element 101, the second capping layer 112 corresponding to the second light-emitting element 102, and the third capping layer 113 corresponding to the third light-emitting element 103. That is, the capping layer 110 is regionalized to correspond to the respective light-emitting elements. In addition, at least one of the first capping layer 111, the second capping layer 112 and the third capping layer 113 contains the ultraviolet light absorber having a 20% or more absorption rate A for the light having the wavelength ranging from 380 nm to 410 nm. The ultraviolet light, due to its high energy, can easily decompose organic light-emitting materials, in particularly phosphorescent materials, and has detrimental effects on human eyes. In the present disclosure, through the addition of the ultraviolet light absorber in at least one of the first capping layer, the second capping layer and the third capping layer, the irradiation of the ultraviolet light on the phosphorescent material can be reduced, and the human eyes are protected from being irradiated by the high energy light, thereby improving the performance of the display panel and providing a better user experience.

In an embodiment, a light-emitting material of the light-emitting layer of at least one of the first to third light-emitting elements, corresponding to the at least one of the first capping layer 111, the second capping layer 112 and the third capping layer 113 containing the ultraviolet light absorber is a phosphorescent material. Generally, if red and green light-emitting materials in the display panel are the phosphorescent material and the blue light-emitting material is a fluorescent material, the ultraviolet light absorber is added in the capping layers corresponding to the light-emitting elements emitting red and/or green light. In the present disclosure, if the first color is blue, the second color is green, and the third color is red, the ultraviolet light absorber is added in the second capping layer 112 and the third capping layer 113. Since the phosphorescent material is more likely to be decomposed under the refraction of ultraviolet light, the addition of the ultraviolet light absorber in the capping layer can protect the phosphorescent material from being irradiated by the ultraviolet light, thereby ensuring normal display of the display panel.

In a further embodiment, one of the first to third light-emitting elements, corresponding to one of the first capping layer 111, the second capping layer 112 and the third capping layer 113 containing the ultraviolet light absorber, emits blue light. In one embodiment, the first color is blue, the second color is green, and the third color is red, and the ultraviolet light absorber is added in the first capping layer 111. Light emitted by the blue light-emitting material contains high energy light having the wavelength ranging from 380 nm to 410 nm which is harmful to the human eyes, but the ultraviolet light absorber added in the capping layer absorbs the high energy light, thereby protecting the human eyes from being hurt and improving the user experience.

In other variations of the present embodiment, the ultraviolet light absorber can be added to each of the first capping layer 111, the second capping layer 112 and the third capping layer 113, and the content of the ultraviolet light absorber included in each capping layer can be adjusted to reach the desired effect of the respective light-emitting layer mentioned above, which will be described in detail below.

In an embodiment, the ultraviolet light absorber can be a material selected from the group consisting of benzotriazole, benzophenone, salicylic acid, salicylate, cyanoacrylate, cinnamate, oxanilide, polystyrene, polyferrocenylsilane, azomethine, triazine, p-aminobenzoic acid, cinnamic acid, urocanic acid, and combinations thereof. The above-mentioned materials have a certain absorption rate for light having a wavelength ranging from 380 nm to 410 nm, so that they can satisfy embodiments of the present disclosure.

Further, in an embodiment, the ultraviolet light absorber is doped in the capping layer at a mass concentration ranging from 5% to 40%, which enables the majority of the above materials to have the absorption rate greater than or equal to 20% for the light having the wavelength of 380 nm to 410 nm.

In an embodiment, $\lambda 1=400$ nm, and $\lambda 2=490$ nm, i.e., the first color is blue; $\lambda 3=500$ nm, and $\lambda 4=590$ nm, i.e., the second color is green; and $\lambda 5=600$ nm, and $\lambda 6=720$ nm, i.e., the third color is red.

In an embodiment, as described above, the first color is blue, the second color is green, and the third color is red, moreover, the first capping layer 111 contains a first ultraviolet light absorber, the second capping layer 112 contains a second ultraviolet light absorber, and the third capping layer 113 contains a third ultraviolet light absorber.

Based on the above, in some embodiments, for the light having a wavelength ranging from 380 nm to 410 nm, an absorption rate of the second ultraviolet light absorber and/or an absorption rate of the third ultraviolet light absorber are greater than an absorption rate of the first ultraviolet light absorber. Since the ambient light includes light of various wavelengths, among which the content of ultraviolet light is higher, the capping layers corresponding to the green and red light-emitting elements adopting the phosphorescent material may be required to be doped with the ultraviolet light absorber having higher absorption rate to avoid interference of ultraviolet light to the phosphorescent material. On contrast, since the ultraviolet light has less influence on the fluorescent material, and the blue light include a smaller content of ultraviolet light than the ambient light, the capping layer corresponding to the blue light-emitting element could have a relatively lower absorption rate for the ultraviolet light.

In this case, the materials of the second ultraviolet light absorber and the third ultraviolet light absorber can be the same or different, but both of them are different from the material of the first ultraviolet light absorber, thereby satisfying different requirements on ultraviolet light absorption rate.

Under the above premise, in other embodiments, the doping concentration of the second ultraviolet light absorber in the second capping layer 112 and/or the doping concentration of the third ultraviolet light absorber in the third capping layer 113 are greater than the doping concentration of the first ultraviolet light absorber in the first capping layer 111. In this way, the light-emitting elements emitting red and green light can be better protected, while the requirements of the blue light-emitting elements are also satisfied. In this case, the first ultraviolet light absorber, the second ultraviolet light absorber, and the third ultraviolet light absorber can be the same material.

In an embodiment, the capping layer can further include a visible light absorber. When the light color corresponding to the first capping layer 111 is not explicitly assigned, it can be set that the first capping layer 111 can include a first visible light absorber. The first visible light absorber has an absorption rate A1 greater than or equal to 30% for the light of the second color having the wavelength ranging from $\lambda 3$ to $\lambda 4$, and/or the first visible light absorber has an absorption rate A1 greater than or equal to 30% for the light of the third color having the wavelength ranging from $\lambda 5$ to $\lambda 6$. Through such design, when the ambient light is irradiated onto the light-emitting element 100, the first capping layer 111 can transmit more light having the color corresponding to the first light-emitting element 101 by filtering out light having other colors. In this way, the light extraction efficiency of light having different colors under the ambient light can be enhanced, and thus the contrast of the display panel under ambient light can be improved.

In an embodiment, the second capping layer includes a second visible light absorber. The second visible light absorber has an absorption rate A2 greater than or equal to 30% for the light of the first color having the wavelength ranging from $\lambda 1$ to $\lambda 2$, and/or the second visible light absorber has an absorption rate A2 greater than or equal to 30% for the light of the third color having the wavelength ranging from $\lambda 5$ to $\lambda 6$. The third capping layer includes a third visible light absorber. The third visible light absorber has an absorption rate A3 greater than or equal to 30% for the light of the first color having the wavelength ranging from $\lambda 1$ to $\lambda 2$, and/or the third visible light absorber has an absorption rate A3 greater than or equal to 30% for the light of the third color having the wavelength ranging from $\lambda 5$ to $\lambda 6$. Through such design, under the ambient light irradiation, the light of different colors can be respectively intensified, and thus the contrast of the display panel under ambient light can be further improved.

In addition, in an embodiment, the first capping layer 111 has a transmittance T1 greater than or equal to 90% for the light of the first color having the wavelength ranging from $\lambda 1$ to $\lambda 2$; the second capping layer 112 has a transmittance T2 greater than or equal to 90% for the light of the second color having the wavelength ranging from $\lambda 3$ to $\lambda 4$; and the third capping layer 113 has a transmittance T3 greater than or equal to 90% for the light of the third color having the wavelength ranging from $\lambda 5$ to $\lambda 6$. In this way, the capping layers can sufficiently transmit the light of the respective light-emitting elements corresponding thereto, thereby ensuring the light extraction efficiency of the light-emitting element.

In an embodiment, a refractive index of the first capping layer 111 for the light of the first color having the wavelength ranging from $\lambda 1$ to $\lambda 2$ is greater than a refractive index of the first capping layer 111 for the light of the second color having the wavelength ranging from $\lambda 3$ to $\lambda 4$, and is greater than a refractive index of the first capping layer 111 for the light of the third color having the wavelength ranging from $\lambda 5$ to $\lambda 6$; a refractive index of the second capping layer 112 for the light of the second color having the wavelength ranging from $\lambda 3$ to $\lambda 4$ is greater than a refractive index of the second capping layer 112 for the light of the first color having the wavelength ranging from $\lambda 1$ to $\lambda 2$, and is greater than a refractive index of the second capping layer 112 for the light of the third color having the wavelength ranging from $\lambda 5$ to $\lambda 6$; and a refractive index of the third capping layer 113 for the light of the third color having the wavelength ranging from $\lambda 5$ to $\lambda 6$ is greater than a refractive index of the third capping layer 113 for the light of the first color having the wavelength ranging from λ1 to λ2, and is greater than a refractive index of the third capping layer 113 for the light of the second color having the wavelength ranging from λ3 to λ4. The capping layer mainly serves to optimize the emergence angle of the light emitted from the light-emitting element and enhance the luminous efficiency of the light-emitting element, thereby preventing the light from returning back to the inside of the light-emitting element due to a total reflection. When the capping layer has a greater refractive index, it is more likely to avoid that the light passing through the capping layer is totally reflected. Therefore, the above design allows excellent light extraction efficiencies of the respective light-emitting elements for the light of specific colors generated therefrom, thereby ensuring the light extraction efficiencies of light of various colors and improving the contrast of the display panel.

Figure 3:
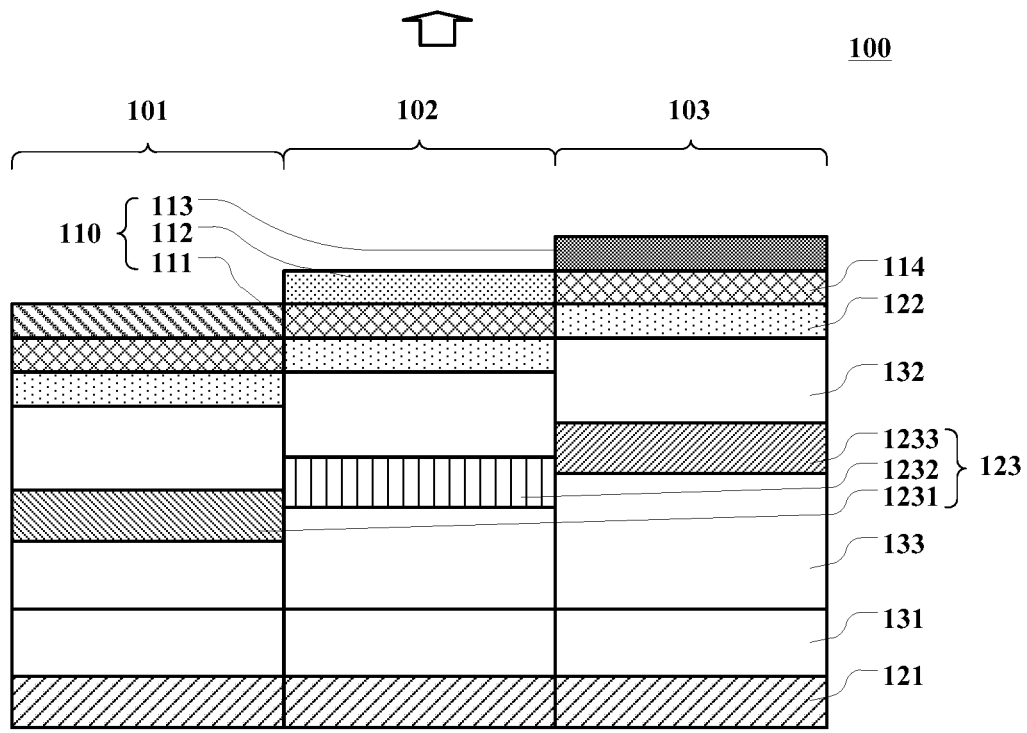
FIG. 3 is a schematic diagram of another light-emitting element according to another embodiment of the present disclosure.

FIG. 3 is a schematic diagram of a light-emitting element according to another embodiment of the present disclosure. Referring to FIG. 3, the display panel 10 further includes a fourth capping layer 114, and the light-emitting element 100 includes a cathode 122. The fourth capping layer 114 is located between the first to third capping layers 111, 112, 113 and the cathode 122. Since the first capping layer 111, the second capping layer 112, and the third capping layer 113 are separately fabricated, the cathode 122 is likely to be eroded and the inside of the light-emitting element 100 can be adversely affected during a practical fabricating process. By providing the fourth capping layer 114 for the first capping layer 111, the second capping layer 112, and the third capping layer 113, the cathode 122 and other components inside the light-emitting element 100 can be protected from being affected in the subsequent fabricating processes. In addition, the light extraction efficiency of the display panel can be further enhanced by setting the refractive index difference between the fourth capping layer 114 and any one of the other three capping layers.

Figure 4:
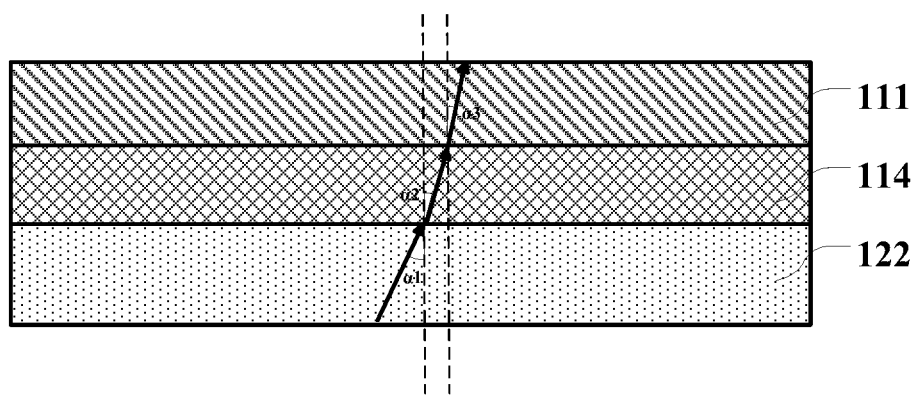
FIG. 4 is a schematic diagram illustrating a propagating direction of light of a capping layer according to an embodiment of the present disclosure.

In an embodiment, the first capping layer 111 has a greater refractive index for the light of the first color having the wavelength ranging from λ1 to λ2 than the fourth capping layer 114; the second capping layer 112 has a greater refractive index for the light of the second color having the wavelength ranging from λ3 to λ4 than the fourth capping layer 114; and the third capping layer 113 has a greater refractive index for the light of the third color having the wavelength ranging from λ5 to λ6 than the fourth capping layer 114. FIG. 4 is a schematic diagram illustrating a propagating direction of light of a capping layer according to an embodiment of the present disclosure. Referring to FIG. 4, taking the first light-emitting element 101 as an example, the light enters the fourth capping layer 114 after passing through the cathode 122. In order to improve a light extraction efficiency, it can be set that $\alpha 3 < \alpha 2 < \alpha 1$ according to the law of refraction. In this regard, the light propagates in a direction gradually close to a vertical direction from the cathode 122 to the first capping layer 111, and thus the light can be emitted to the outside of the display panel as much as possible. Therefore, it can be avoided that a part of the light returns to the inside of the light-emitting element due to the total reflection in case of a relatively large $\alpha 1$, thereby reducing the loss of light and improving the luminous efficiency of the display panel.

In an embodiment, at least two of the first capping layer 111, the second capping layer 112, and the third capping layer 113 are not connected to each other. The fourth capping layer 114 is integrally disposed on the first light-emitting element 101, the second light-emitting element 102, and the third light-emitting element 103, and has a certain light extraction effect. Therefore, the first capping layer 111 can be disposed only on the first light-emitting element 101, the second capping layer 112 is disposed only on the second light-emitting element 102, and the third capping layer 113 is disposed only on the third light-emitting element 103. None of the capping layers is disposed on a non-light-emitting region between the light-emitting elements. Therefore, the function of each capping layer can be achieved, while the material and costs can be saved.

Another embodiment of the present disclosure provides a display apparatus, including the display panel according to any of the embodiments described above.

Figure 5:
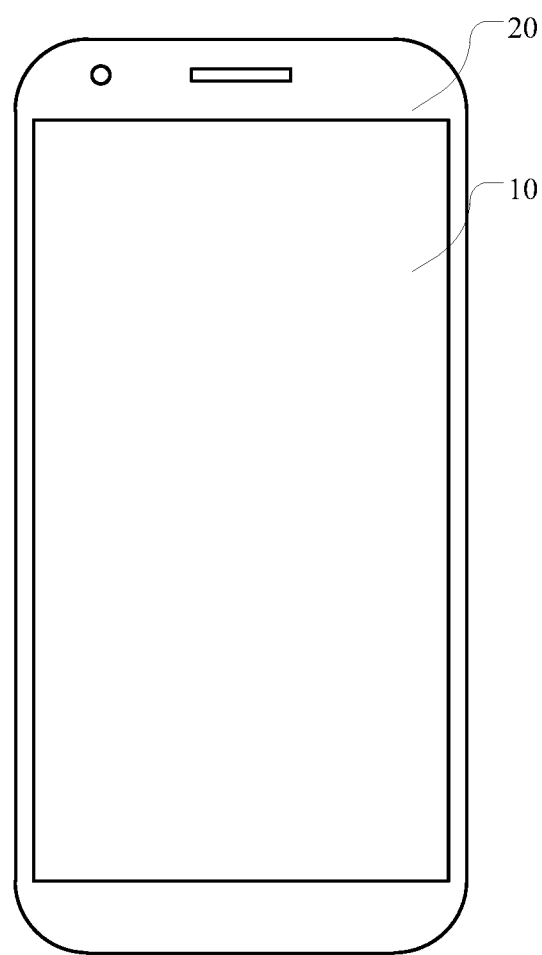
FIG. 5 is a schematic diagram of a display apparatus according to an embodiment of the present disclosure.

FIG. 5 is a schematic diagram of a display apparatus according to an embodiment of the present disclosure. Referring to FIG. 5, the display apparatus 20 includes a display panel 10, which can be the display panel according to any of the above embodiments. The display apparatus 20 can be a mobile phone, a notebook computer, a television, a watch, or a smart wearable display apparatus, which is not specifically limited in the present disclosure.

In view of the above description, in the display panel and the display apparatus provided by the embodiments of the present disclosure, the capping layer 110 is divided into the first capping layer 111 corresponding to the first light-emitting element 101, the second capping layer 112 corresponding to the second light-emitting element 102, and the third capping layer 113 corresponding to the third light-emitting element 103. That is, the capping layer 110 is regionalized to correspond to the respective light-emitting elements. In addition, at least one of the first capping layer 111, the second capping layer 112 and the third capping layer 113 contains the ultraviolet light absorber, and the ultraviolet light absorber can absorb light having the wavelength ranging from 380 nm to 410 nm with the absorption rate A greater than or equal to 20%. The ultraviolet light, due to its high energy, can easily decompose organic light-emitting materials, in particularly phosphorescent materials, and has detrimental effects on human eyes. In the present disclosure, through the addition of the ultraviolet light absorber in at least one of the first capping layer, the second capping layer and the third capping layer, the irradiation of the ultraviolet light on the phosphorescent material can be reduced, and the human eyes are protected from being irradiated by the high energy light, thereby improving the performance of the display panel and providing a better user experience. In the meantime, when the first capping layer 111, the second capping layer 112 and the third capping layer 113 are designed to contain the visible light absorber, the contrast of the display panel under the ambient light can be further enhanced, thereby providing a better visual effect.

What is claimed is:
1. A display panel, comprising:
a plurality of light-emitting elements, the plurality of light-emitting elements comprising a first light-emitting element that emits light of a first color having a wavelength ranging from λ1 to λ2, a second light-emitting element that emits light of a second color having a wavelength ranging from λ3 to λ4, and a third light-emitting element that emits light of a third color having a wavelength ranging from λ5 to λ6,
a first capping layer covering a light-exiting side of the first light-emitting element,
a second capping layer covering a light-exiting side of the second light-emitting element, and
a third capping layer covering a light-exiting side of the third light-emitting element, wherein the first color is blue, the second color is green, and the third color is red, wherein each of the second light-emitting element and the third light-emitting element comprises a light-emitting layer made of a phosphorescent material, and the first light-emitting element comprises a light-emitting layer made of a fluorescent material, wherein the first capping layer contains a first ultraviolet light absorber, the second capping layer contains a second ultraviolet light absorber, and the third capping layer contains a third ultraviolet light absorber, wherein each of the first ultraviolet light absorber, the second ultraviolet light absorber, and the third ultraviolet light absorber absorbs light having a wavelength ranging from 380 nm to 410 nm with an absorption rate A (380 nm-410 nm) greater than or equal to 20%, wherein an absorption rate of the second ultraviolet light absorber for the light having the wavelength ranging from 380 nm to 410 nm and/or an absorption rate of the third ultraviolet light absorber for the light having the wavelength ranging from 380 nm to 410 nm are greater than an absorption rate of the first ultraviolet light absorber for the light having a wavelength ranging from 380 nm to 410 nm.

2. The display panel according to claim 1, wherein each of the first ultraviolet light absorber, the second ultraviolet light absorber, and the third ultraviolet light absorber is selected from the group consisting of benzotriazole, benzophenone, salicylic acid, salicylate, cyanoacrylate, cinnamate, oxanilide, polystyrene, polyferrocenylsilane, azomethine, triazine, p-aminobenzoic acid, cinnamic acid, urocanic acid, and combinations thereof.

3. The display panel according to claim 1, wherein the first ultraviolet light absorber is doped in the first capping layer at a mass concentration ranging from 5% to 40%, the second ultraviolet light absorber is doped in the second capping layer at a mass concentration ranging from 5% to 40%, and the third ultraviolet light absorber is doped in the third capping layer at a mass concentration ranging from 5% to 40%.

4. The display panel according to claim 1, wherein $\lambda 1=400$ nm, $\lambda 2=490$ nm, $\lambda 3=500$ nm, $\lambda 4=590$ nm, $\lambda 5=600$ nm, and $\lambda 6=720$ nm.

5. The display panel according to claim 1, wherein a doping concentration of the second ultraviolet light absorber in the second capping layer and/or a doping concentration of the third ultraviolet light absorber in the third capping layer are greater than a doping concentration of the first ultraviolet light absorber in the first capping layer.

6. The display panel according to claim 5, wherein the first ultraviolet light absorber, the second ultraviolet light absorber, and the third ultraviolet light absorber are a same material.

7. The display panel according to claim 1, wherein the first capping layer contains a first visible light absorber, and the first visible light absorber has an absorption rate $A1(\lambda 3-\lambda 4)$ greater than or equal to 30% for the light of the second color having the wavelength ranging from $\lambda 3$ to $\lambda 4$; and/or the first visible light absorber has an absorption rate $A1(\lambda 5-\lambda 6)$ greater than or equal to 30% for the light of the third color having the wavelength ranging from $\lambda 5$ to $\lambda 6$.

8. The display panel according to claim 7, wherein the second capping layer contains a second visible light absorber, wherein the second visible light absorber has an absorption rate $A2(\lambda 1-\lambda 2)$ greater than or equal to 30% for the light of the first color having the wavelength ranging from $\lambda 1$ to $\lambda 2$; and/or the second visible light absorber has an absorption rate $A2(\lambda 5-\lambda 6)$ greater than or equal to 30% for the light of the third color having the wavelength ranging from $\lambda 5$ to $\lambda 6$, and the third capping layer contains a third visible light absorber, wherein the third visible light absorber has an absorption rate $A3(\lambda 1-\lambda 2)$ greater than or equal to 30% for the light of the first color having the wavelength ranging from $\lambda 1$ to $\lambda 2$, and/or the third visible light absorber has an absorption rate $A3(\lambda 5-\lambda 6)$ greater than or equal to 30% for the light of the third color having the wavelength ranging from $\lambda 5$ to $\lambda 6$.

9. The display panel according to claim 5, wherein the first capping layer has a transmittance $T1(\lambda 1-\lambda 2)$ greater than or equal to 90% for the light of the first color having the wavelength ranging from $\lambda 1$ to $\lambda 2$;

the second capping layer has a transmittance $T2(\lambda 3-\lambda 4)$ greater than or equal to 90% for the light of the second color having the wavelength ranging from $\lambda 3$ to $\lambda 4$; and the third capping layer has a transmittance $T3(\lambda 5-\lambda 6)$ greater than or equal to 90% for the light of the third color having the wavelength ranging from $\lambda 5$ to $\lambda 6$.

10. The display panel according to claim 1, wherein a refractive index of the first capping layer for the light of the first color having the wavelength ranging from $\lambda 1$ to $\lambda 2$ is greater than a refractive index of the first capping layer for the light of the second color having the wavelength ranging from $\lambda 3$ to $\lambda 4$, and is greater than a refractive index of the first capping layer for the light of the third color having the wavelength ranging from $\lambda 5$ to $\lambda 6$;

a refractive index of the second capping layer for the light of the second color having the wavelength ranging from $\lambda 3$ to $\lambda 4$ is greater than a refractive index of the second capping layer for the light of the first color having the wavelength ranging from $\lambda 1$ to $\lambda 2$, and is greater than a refractive index of the second capping layer for the light of the third color having the wavelength ranging from $\lambda 5$ to $\lambda 6$; and a refractive index of the third capping layer for the light of the third color having the wavelength ranging from $\lambda 5$ to $\lambda 6$ is greater than a refractive index of the third capping layer for the light of the first color having the wavelength ranging from $\lambda 1$ to $\lambda 2$, and is greater than a refractive index of the third capping layer for the light of the second color having the wavelength ranging from $\lambda 3$ to $\lambda 4$.

11. The display panel according to claim 1, further comprising a fourth capping layer, wherein each of the first to third light-emitting elements comprises a cathode layer, and the fourth capping layer is disposed between the cathode layer of each of the first to third light-emitting elements and the first to third capping layers.

12. The display panel according to claim 11, wherein the first capping layer has a greater refractive index for the light of the first color having the wavelength ranging from $\lambda 1$ to $\lambda 2$ than a fourth capping layer;

the second capping layer has a greater refractive index for the light of the second color having the wavelength ranging from $\lambda 3$ to $\lambda 4$ than the fourth capping layer; and the third capping layer has a greater refractive index for the light of the third color having the wavelength ranging from $\lambda 5$ to $\lambda 6$ than the fourth capping layer.

13. The display panel according to claim 11, wherein at least two of the first capping layer, the second capping layer and the third capping layer are spaced from and not connected with each other.

14. A display apparatus comprising a display panel, wherein the display panel comprises:
a plurality of light-emitting elements, the plurality of light-emitting elements comprising a first light-emitting element that emits light of a first color having a wavelength ranging from $\lambda 1$ to $\lambda 2$, a second light-emitting element that emits light of a second color having a wavelength ranging from $\lambda 3$ to $\lambda 4$, and a third light-emitting element that emits light of a third color having a wavelength ranging from $\lambda 5$ to $\lambda 6$,
a first capping layer covering a light-exiting side of the first light-emitting element,
a second capping layer covering a light-exiting side of the second light-emitting element, and
a third capping layer covering a light-exiting side of the third light-emitting element,
wherein the first color is blue, the second color is green, and the third color is red,
wherein each of the second light-emitting element and the third light-emitting element comprises a light-emitting layer made of a phosphorescent material, and the first light-emitting element comprises a light-emitting layer made of a fluorescent material,
wherein the first capping layer contains a first ultraviolet light absorber, the second capping layer contains a second ultraviolet light absorber, and the third capping layer contains a third ultraviolet light absorber,
wherein each of the first ultraviolet light absorber, the second ultraviolet light absorber, and the third ultraviolet light absorber absorbs light having a wavelength ranging from 380 nm to 410 nm with an absorption rate A (380 nm-410 nm) greater than or equal to 20%,
wherein an absorption rate of the second ultraviolet light absorber for the light having the wavelength ranging from 380 nm to 410 nm and/or an absorption rate of the third ultraviolet light absorber for the light having the wavelength ranging from 380 nm to 410 nm are greater than an absorption rate of the first ultraviolet light absorber for the light having a wavelength ranging from 380 nm to 410 nm.

* * * * *